(12) United States Patent
Lee

(10) Patent No.: US 12,249,380 B2
(45) Date of Patent: Mar. 11, 2025

(54) SEMICONDUCTOR MEMORY DEVICE WITH VOLTAGES APPLIED TO GLOBAL DRAIN SELECT LINES AND METHOD OF OPERATING THE SEMICONDUCTOR MEMORY DEVICE

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 217 days.

(21) Appl. No.: 18/077,572

(22) Filed: Dec. 8, 2022

(65) Prior Publication Data
US 2024/0021248 A1 Jan. 18, 2024

(30) Foreign Application Priority Data
Jul. 12, 2022 (KR) .................. 10-2022-0085352

(51) Int. Cl.
*G11C 16/14* (2006.01)
*G11C 16/04* (2006.01)
*G11C 16/32* (2006.01)

(52) U.S. Cl.
CPC .......... *G11C 16/14* (2013.01); *G11C 16/0483* (2013.01); *G11C 16/32* (2013.01)

(58) Field of Classification Search
CPC ..... G11C 16/14; G11C 16/0483; G11C 16/32; G11C 16/16; G11C 16/10; G11C 16/24; G11C 16/26; G11C 16/30; G11C 16/08
See application file for complete search history.

(56) References Cited

FOREIGN PATENT DOCUMENTS

KR 1020160043747 A 4/2016
KR 1020190105326 A 9/2019

*Primary Examiner* — Jerome Leboeuf
(74) *Attorney, Agent, or Firm* — WILLIAM PARK & ASSOCIATES LTD.

(57) ABSTRACT

Provided herein is a semiconductor memory device and a method of operating the semiconductor memory device. The semiconductor memory device includes a memory block including memory cell strings, a voltage supply circuit configured to apply operating voltages to global drain select lines, global source select lines, and global word lines, and apply an erase voltage to bit lines or to the bit lines and a source line during an erase operation, a pass circuit configured to couple the global drain select lines, global source select lines, and global word lines to local drain select lines, local source select lines, and local word lines in response to a block select signal, and control logic configured to control the voltage supply circuit to apply a first operating voltage to the global drain select lines and thereafter apply a second operating voltage to the global drain select lines.

19 Claims, 10 Drawing Sheets

SEMICONDUCTOR MEMORY DEVICE WITH VOLTAGES APPLIED TO GLOBAL DRAIN SELECT LINES AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2022-0085352, filed on Jul. 12, 2022, in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device and a method of operating the semiconductor memory device.

2. Related Art

Semiconductor devices, in particular, semiconductor memory devices are classified into volatile memory devices and nonvolatile memory devices.

Such a nonvolatile memory device has relatively low write and read speeds, but retains data stored therein even when the supply of power is interrupted. Therefore, the nonvolatile memory device is used to store data to be retained regardless of whether power is supplied. Representative examples of the nonvolatile memory devices include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. The flash memory is classified into a NOR type and a NAND type.

The flash memory has both the advantage of RAM in which data is freely programmable and erasable and the advantage of ROM in which data stored therein can be retained even when the supply of power is interrupted. Such a flash memory is widely used as a storage medium for portable electronic devices such as a digital camera, a personal digital assistant (PDA), and an MP3 player.

SUMMARY

An embodiment of the present disclosure may provide for a semiconductor memory device. The semiconductor memory device may include a memory block including a plurality of memory cell strings, a voltage supply circuit configured to apply operating voltages to global drain select lines, global source select lines, and global word lines, and to apply an erase voltage to bit lines of the memory block or to the bit lines and a source line of the memory block during an erase operation, a pass circuit configured to couple the global drain select lines, the global source select lines, and the global word lines to local drain select lines, local source select lines, and local word lines, respectively, in response to a block select signal, and control logic configured to control the voltage supply circuit to apply a first operating voltage to the global drain select lines and thereafter apply a second operating voltage, having a potential higher than a potential of the block select signal, to the global drain select lines, wherein the voltage supply circuit applies the second operating voltage to a first global drain select line, among the global drain select lines, and applies the second operating voltage to a second global drain select line, among the global drain select lines, after a certain time has elapsed.

An embodiment of the present disclosure may provide for a semiconductor memory device. The semiconductor memory device may include a memory block including a plurality of memory cell strings, a voltage supply circuit configured to apply operating voltages to global drain select lines, global source select lines, and global word lines, and to apply an erase voltage to bit lines of the memory block or to the bit lines and a source line of the memory block during an erase operation, a pass circuit configured to couple the global drain select lines, the global source select lines, and the global word lines to local drain select lines, local source select lines, and local word lines, respectively, in response to a block select signal, and control logic configured to control the voltage supply circuit to apply a first operating voltage to the global drain select lines and thereafter apply a second operating voltage, having a potential higher than a potential of the block select signal, to the global drain select lines, wherein the voltage supply circuit applies the first operating voltage to a first global drain select line, among the global drain select lines, and applies a first offset operating voltage having a potential lower than a potential of the first operating voltage to a second global drain select line, among the global drain select lines.

An embodiment of the present disclosure may provide for a method of operating a semiconductor memory device. The method may include coupling global drain select lines to local drain select lines of a memory block in response to a block select signal, applying a first operating voltage to the global drain select lines, applying an erase voltage to bit lines of the memory block or to the bit lines and a source line of the memory block, allowing a first local drain select line corresponding to a first memory cell string, among the local drain select lines, to float by applying a second operating voltage, having a potential higher than a potential of the block select signal, to a first global drain select line corresponding to the first memory cell string, among the global drain select lines, and allowing a second local drain select line corresponding to a second memory cell string, among the local drain select lines, to float by applying the second operating voltage to the first global drain select line, and applying the second operating voltage to a second global drain select line corresponding to a second memory cell string, among the global drain select lines, after a certain time has elapsed.

An embodiment of the present disclosure may provide for a method of operating a semiconductor memory device. The method may include coupling global drain select lines to local drain select lines of a memory block in response to a block select signal, applying a first operating voltage to a first global drain select line corresponding to a first memory cell string, among the global drain select lines, and applying a first offset operating voltage, having a potential lower than a potential of the first operating voltage, to a second global drain select line corresponding to a second memory cell string, among the global drain select lines, applying an erase voltage to bit lines of the memory block or to the bit lines and the source line of the memory block, and allowing the local drain select lines to float by applying a second operating voltage, having a potential higher than a potential of the block select signal, to the global drain select lines.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a semiconductor memory device that is capable of improving the erase speeds of a plurality of memory cells strings so that the erase speeds are uniform during an erase operation of the semiconductor memory device, and a method of operating the semiconductor memory device.

Hereinafter, the present disclosure will be described in detail based on embodiments of the present disclosure with reference to the attached drawings. Below, embodiments of the present disclosure will be described in detail with reference to the attached drawings.

Figure 1:
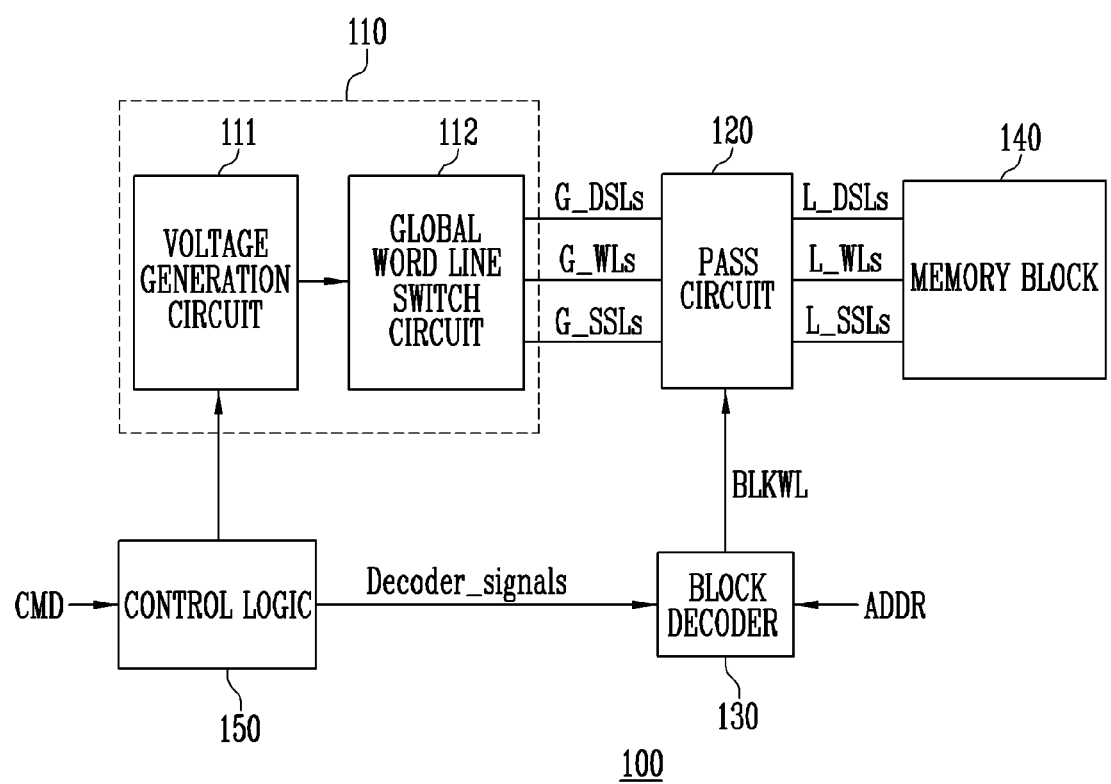
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 may include a voltage supply circuit 110, a pass circuit 120, a block decoder 130, a memory block 140, and control logic 150. The control logic 150 may be implemented as hardware, software, or a combination of hardware and software. For example, the control logic 150 may be a control logic circuit operating in accordance with an algorithm and/or a processor executing control logic code.

The voltage supply circuit 110 may be configured to include a voltage generation circuit 111 and a global word line switch circuit 112.

The voltage generation circuit 111 generates a plurality of operating voltages to be used to perform the overall operation of the semiconductor memory device 100. For example, the voltage generation circuit 111 may generate a plurality of operating voltages to be applied to the memory block 140 during an erase operation of the semiconductor memory device 100. For example, during an erase operation, the voltage generation circuit 111 may generate a plurality of operating voltages to be applied to a plurality of word lines, a plurality of drain select lines, and a plurality of source select lines of the memory block 140, and may output the operating voltages to the global word line switch circuit 112. Further, the voltage generation circuit 111 may generate an erase voltage and apply the erase voltage to a source line and a plurality of bit lines of the memory block 140.

The global word line switch circuit 112 may switch the plurality of operating voltages generated by the voltage generation circuit 111, and may transmit the operating voltages to a plurality of global drain select lines G_DSLs, a plurality of global word lines G_WLs, and a plurality of global source select lines G_SSLs.

The pass circuit 120 may be coupled between the plurality of global drain select lines G_DSLs, the plurality of global word lines G_WLs, and the plurality of global source select lines G_SSLs and a plurality of local drain select lines L_DSLs, a plurality of local word lines L_WLs, and a plurality of local source select lines L_SSLs. The pass circuit 120 may couple or decouple the plurality of global drain select lines G_DSLs, the plurality of global word lines G_WLs, and the plurality of global source select lines G_SSLs to or from the plurality of local drain select lines L_DSLs, the plurality of local word lines L_WLs, and the plurality of local source select lines L_SSLs in response to a block select signal BLKWL.

The block decoder 130 may generate the block select signal BLKWL in response to an address signal ADDR and a decoder control signal Decoder_signals. For example, when the address signal ADDR corresponds to the memory block 140, the block decoder 130 may generate the block select signal BLKWL enabled to a high potential level, and may output the block select signal BLKWL to the pass circuit 120.

The memory block 140 includes a plurality of memory cells. In an embodiment, the plurality of memory cells may be nonvolatile memory cells. Memory cells coupled to the same word line, among the plurality of memory cells, are defined as one page. Further, the memory block 140 may include a plurality of memory cell strings.

A detailed configuration of the memory block 140 will be described later.

The control logic 150 may control the voltage supply circuit 110 and the block decoder 130 in response to a command signal CMD input from an external device. For example, when a command signal CMD related to an erase operation is input, the control logic 150 controls the voltage generation circuit 111 of the voltage supply circuit 110 to generate the plurality of operating voltages and the erase voltage. Furthermore, the control logic 150 may generate the decoder control signal Decoder_signals for controlling the block decoder 130.

Figure 2:
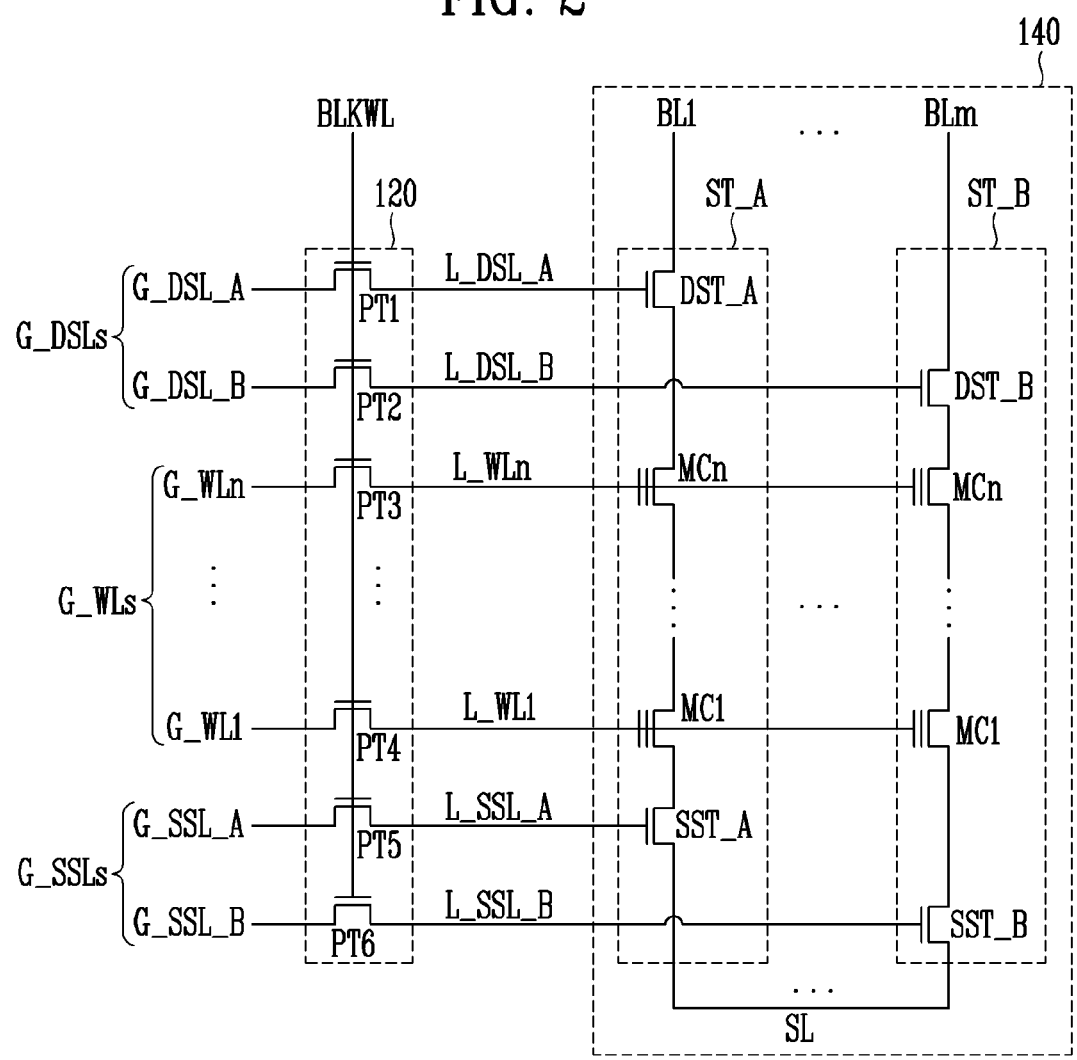
FIG. 2 is a circuit diagram illustrating a pass circuit and a memory block of FIG. 1.

FIG. 2 is a circuit diagram illustrating the pass circuit and the memory block of FIG. 1.

Referring to FIG. 2, the pass circuit 120 may be configured to include a plurality of pass transistors PT1 to PT6.

The respective pass transistors PT1 to PT6 may be coupled between a plurality of global drain select lines G_DSLs, a plurality of global word lines G_WLs, and a plurality of global source select lines G_SSLs and a plurality of local drain select lines L_DSLs, a plurality of local word lines L_WLs, and a plurality of local source select lines L_SSLs. The respective pass transistors PT1 to PT6 may couple the plurality of global drain select lines G_DSLs, the plurality of global word lines G_WLs, and the plurality of global source select lines G_SSLs to the plurality of local drain select lines L_DSLs, the plurality of local word lines L_WLs, and the plurality of local source select lines L_SSLs in response to a block select signal BLKWL.

For example, the pass transistor PT1 may be coupled between a first global drain select line G_DSL_A and a first local drain select line L_DSL_A, and the pass transistor PT2 may be coupled between a second global drain select line G_DSL_B and a second local drain select line L_DSL_B. The pass transistor PT3 may be coupled between an n-th global word line G_WLn and an n-th local word line L_WLn, and the pass transistor PT4 may be coupled between a first global word line G_WL1 and a first local word line L_WL1. The pass transistor PT5 may be coupled between a first global source select line G_SSL_A and a first local source select line L_SSL_A, and the pass transistor PT6 may be coupled between a second global source select line G_SSL_B and a second local source select line L_SSL_B.

In an embodiment of the present disclosure, the two global drain select lines G_DSLs and the two global source select lines G_SSLs are illustrated, but the present disclosure is not limited thereto, and two or more global drain select lines G_DSLs and two or more global source select lines G_SSLs may be arranged.

The memory block 140 may include a plurality of memory cell strings ST_A and ST_B. For example, the first memory cell string ST_A may be coupled between a bit line BL1 and a source line SL, and the second memory cell string ST_B may be coupled between a bit line BLm and the source line SL. In an embodiment of the present disclosure, although a structure in which one memory cell string is coupled between one bit line and the source line SL is illustrated and described, a plurality of memory cell strings may be coupled in parallel between one bit line and the source line SL.

The first memory cell string ST_A may include at least one drain select transistor DST_A, a plurality of memory cells MC1 to MCn, and at least one source select transistor SST_A, which are coupled in series between the bit line BL1 and the source line SL. A gate of the at least one drain select transistor DST_A may be coupled to the first local drain select line L_DSL_A, and a gate of the at least one source select transistor SST_A may be coupled to the first local source select line L_SSL_A.

The second memory cell string ST_B may include at least one drain select transistor DST_B, a plurality of memory cells MC1 to MCn, and at least one source select transistor SST_B, which are coupled in series between the bit line BLm and the source line SL. A gate of the at least one drain select transistor DST_B may be coupled to the second local drain select line L_DSL_B, and a gate of the at least one source select transistor SST_B may be coupled to the second local source select line L_SSL_B.

Although one memory cell string is illustrated as being coupled to one local drain select line in an embodiment of the present disclosure, the present disclosure is not limited thereto, and one or more memory cell strings may be coupled to one local drain select line. Further, one or more memory cell strings may be coupled to one local source select line.

A gate of each of the plurality of memory cells MC1 to MCn included in each of the plurality of memory cell strings ST_A and ST_B may be coupled to any one of the local word lines L_WL1 to L_WLn.

The plurality of memory cell strings ST_A and ST_B may be formed to have different cell plug structures depending on the location of arrangement thereof during a manufacturing process. Accordingly, the difference between erase speeds of the memory cell strings ST_A and ST_B may occur depending on the arrangement locations thereof.

Figure 3:
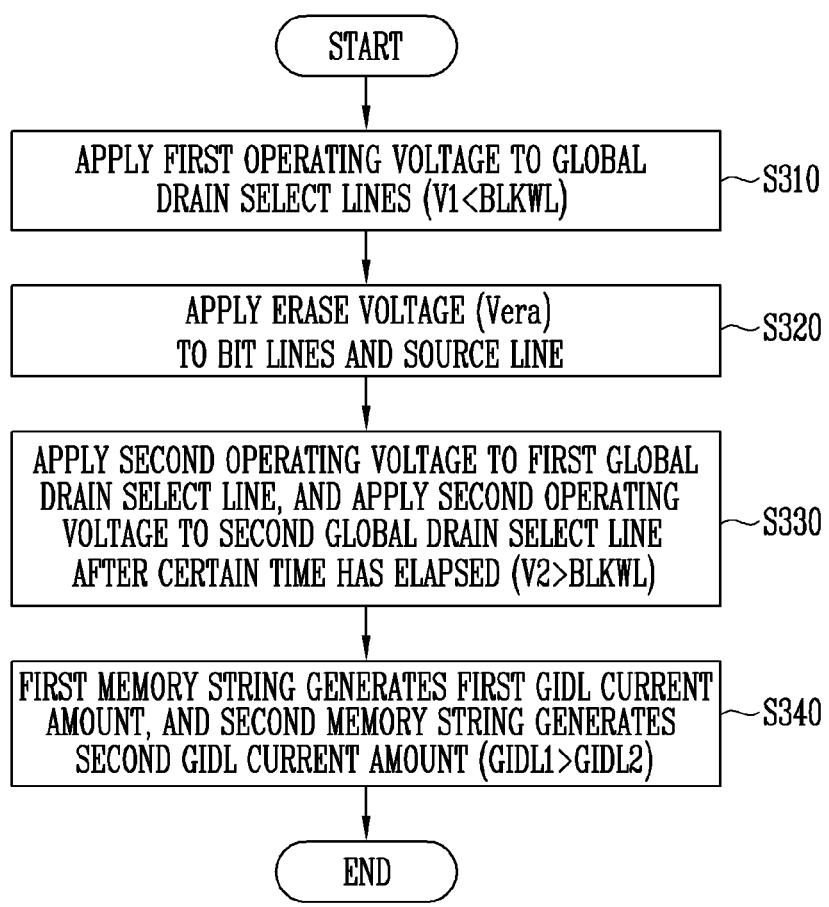
FIG. 3 is a flowchart illustrating a method of operating a semiconductor memory device according to an embodiment of the present disclosure.

FIG. 3 is a flowchart illustrating a method of operating a semiconductor memory device according to an embodiment of the present disclosure.

Figure 4:
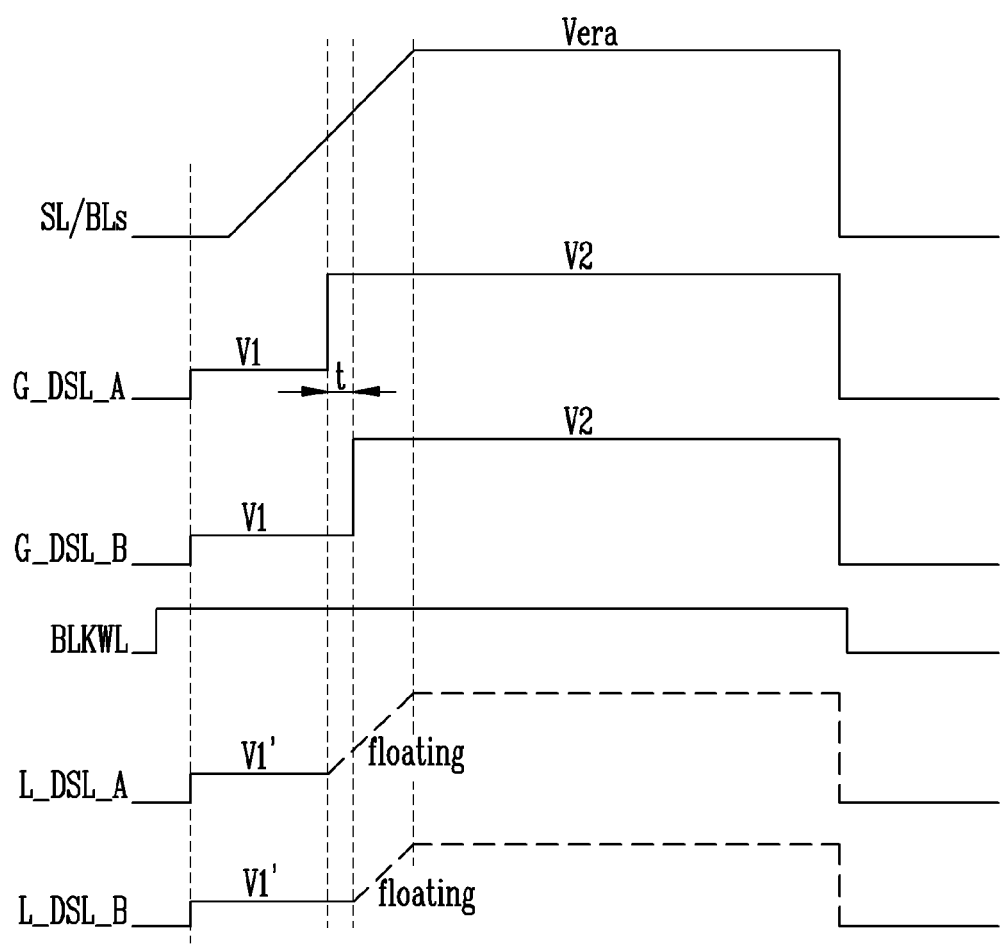
FIG. 4 is a waveform diagram of signals for explaining the method of operating a semiconductor memory device according to an embodiment of the present disclosure.

FIG. 4 is a waveform diagram of signals for explaining the method of operating a semiconductor memory device according to the embodiment of the present disclosure.

The method of operating the semiconductor memory device according to the embodiment of the present disclosure will be described with reference to FIGS. 1 to 4.

In an embodiment of the present disclosure, a description will be made on the assumption that the erase speed of the first memory cell string ST_A is lower than the erase speed of the second memory cell string ST_B. That is, the first memory cell string ST_A may be defined as a memory cell string having a relatively low erase speed, and the second memory cell string ST_B may be defined as a memory cell string having a relatively high erase speed.

At step S310, a first operating voltage V1 may be applied to a plurality of global drain select lines G_DSLs.

For example, the block decoder 130 generates a block select signal BLKWL having a high potential level in response to an address signal ADDR and a decoder control signal Decoder_signals. The pass circuit 120 may couple the plurality of global drain select lines G_DSLs, the plurality of global word lines G_WLs, and the plurality of global source select lines G_SSLs to the plurality of local drain select lines L_DSLs, the plurality of local word lines L_WLs, and the plurality of local source select lines L_SSLs in response to the block select signal BLKWL having a high potential level.

Under the control of the control logic 150, the voltage generation circuit 111 may generate the first operating voltage V1, and apply the first operating voltage V1 to the plurality of global drain select lines G_DSLs, that is, the first global drain select line G_DSL_A and the second global drain select line G_DSL_B. Further, the voltage generation circuit 111 may apply the first operating voltage V1 to the plurality of global source select lines G_SSLs, that is, the first global source select line G_SSL_A and the second global source select line G_SSL_B.

Accordingly, the first local drain select line L_DSL_A coupled to the first global drain select line G_DSL_A and the second local drain select line L_DSL_B coupled to the second global drain select line G_DSL_B may be charged to a potential voltage V1' that is equal to the first operating voltage V1 or lower than the first operating voltage V1 by the threshold voltage of the pass transistor. Here, the first local source select line L_SSL_A coupled to the first global source select line G_SSL_A and the second local source select line L_SSL_B coupled to the second global source select line G_SSL_B may be charged to the potential voltage V1' that is equal to the first operating voltage V1 or lower than the first operating voltage V1 by the threshold voltage of the pass transistor.

The potential of the first operating voltage V1 may be lower than that of the block select signal BLKWL.

At step S320, an erase voltage Vera may be applied to bit lines BL1 to BLm and the source line SL of the memory block 140.

For example, under the control of the control logic 150, the voltage generation circuit 111 may generate the erase voltage Vera that gradually increases as, for example shown in FIG. 4, and may apply the generated erase voltage Vera to the bit lines BL1 to BLm and the source line SL of the memory block 140. After the erase voltage Vera has increased for a certain period, it may be maintained at a constant level, as illustrated in FIG. 4.

At step S330, a second operating voltage V2 may be applied to the first global drain select line G_DSL_A coupled to the first memory cell string ST_A having a relatively low erase speed. After a certain time t has elapsed, the second operating voltage V2 may be applied to the second global drain select line G_DSL_B coupled to the second memory cell string ST_B having a relatively high erase speed.

For example, under the control of the control logic 150, the voltage generation circuit 111 may generate the second operating voltage V2 having a potential higher than that of the first operating voltage V1, may apply the second operating voltage V2 to the first global drain select line G_DSL_A, and may apply the second operating voltage V2 to the second global drain select line G_DSL_B after the certain time t has elapsed. Furthermore, the voltage generation circuit 111 may generate the second operating voltage V2, may apply the second operating voltage V2 to the first global source select line G_SSL_A, and may apply the second operating voltage V2 to the second global source select line G_SSL_B after the certain time t has elapsed.

The potential of the second operating voltage V2 may be higher than that of the block select signal BLKWL. The pass transistor PT1 coupled to the first global drain select line G_DSL_A may be turned off in response to the second operating voltage V2 having a potential higher than that of the block select signal BLKWL applied to the gate thereof, and the first local drain select line L_DSL_A may float. Also, the pass transistor PT5 coupled to the first global source select line G_SSL_A may be turned off in response to the second operating voltage V2 having a potential higher than that of the block select signal BLKWL applied to the gate thereof, and the first local source select line L_SSL_A may float.

After the certain time t has elapsed, the pass transistor PT2 coupled to the second global drain select line G_DSL_B and the pass transistor PT6 coupled to the second global source select line G_SSL_B may be turned off in response to the second operating voltage V2 having a potential high than that of the block select signal BLKWL applied to the gates thereof, and the second local drain select line L_DSL_B and the second local source select line L_SSL_B may float. That is, the first local drain select line L_DSL_A may float earlier than the second local drain select line L_DSL_B by the certain time t. Further, the first local source select line L_SSL_A may float earlier than the second local source select line L_SSL_B by the certain time t.

At step S340, a gate-induced drain leakage (GIDL) current may be generated in a channel in a lower portion of the drain select transistor DST_A of the first memory cell string ST_A and a channel in a lower portion of the drain select transistor DST_B of the second memory cell string ST_B, and the GIDL current amount of the first memory cell string ST_A, that is, a first GIDL current amount GIDL1, may be greater than the GIDL current amount of the second memory cell string ST_B, that is, a second GIDL current amount GIDL2. Furthermore, a GIDL current may be generated in a channel in a lower portion of the source select transistor SST_A of the first memory cell string ST_A and a channel in a lower portion of the source select transistor SST_B of the second memory cell string ST_B.

In the channel of the drain select transistor DST_A of the first memory cell string ST_A coupled to the first local drain select line L_DSL_A, a GIDL current is generated in response to the erase voltage Vera applied through the bit line BL1 and the first local drain select line L_DSL_A that is floating. Further, in the channel of the source select transistor SST_A of the first memory cell string ST_A, a GIDL current is generated in response to the erase voltage Vera applied through the source line SL and the first local source select line L_SSL_A that is floating.

Furthermore, in the channel of the drain select transistor DST_B of the second memory cell string ST_B coupled to the second local drain select line L_DSL_B, a GIDL current is generated in response to the erase voltage Vera applied through the bit line BLm and the second local drain select line L_DSL_B that is floating. Further, in the channel of the source select transistor SST_B of the second memory cell string ST_B, a GIDL current is generated in response to the erase voltage Vera applied through the source line SL and the second local source select line L_SSL_B that is floating.

In this case, because the first local drain select line L_DSL_A floats earlier than the second local drain select line L_DSL_B by the certain time t, the first GIDL current amount GIDL1 of the first memory cell string ST_A may be greater than the second GIDL current amount GIDL2 of the second memory cell string ST_B.

The channel of the first memory cell string ST_A may be boosted by the first GIDL current amount GIDL1, and the channel of the second memory cell string ST_B may be boosted by the second GIDL current amount GIDL2.

Thereafter, the erase voltage Vera may be maintained at a constant level after increasing to a target level, and the voltage generation circuit 111 may apply an erase operating voltage, for example, 0 V, to the plurality of global word lines G_WLs under the control of the control logic 150. Accordingly, an erase operation may be performed on the memory cells MC1 to MCn of the first memory cell string ST_A and the second memory cell string ST_B depending on the difference between the boosting levels of the channels and the potential levels of the local word lines L_WLs.

Here, the channel of the first memory cell string ST_A may be boosted to a level higher than that of the channel of the second memory cell string ST_B by the first GIDL current amount GIDL1 greater than the second GIDL current amount GIDL2, and thus the first memory cell string ST_A having a relatively low erase speed and the second memory cell string ST_B having a relatively high erase speed may be erased at a uniform speed.

Figure 5:
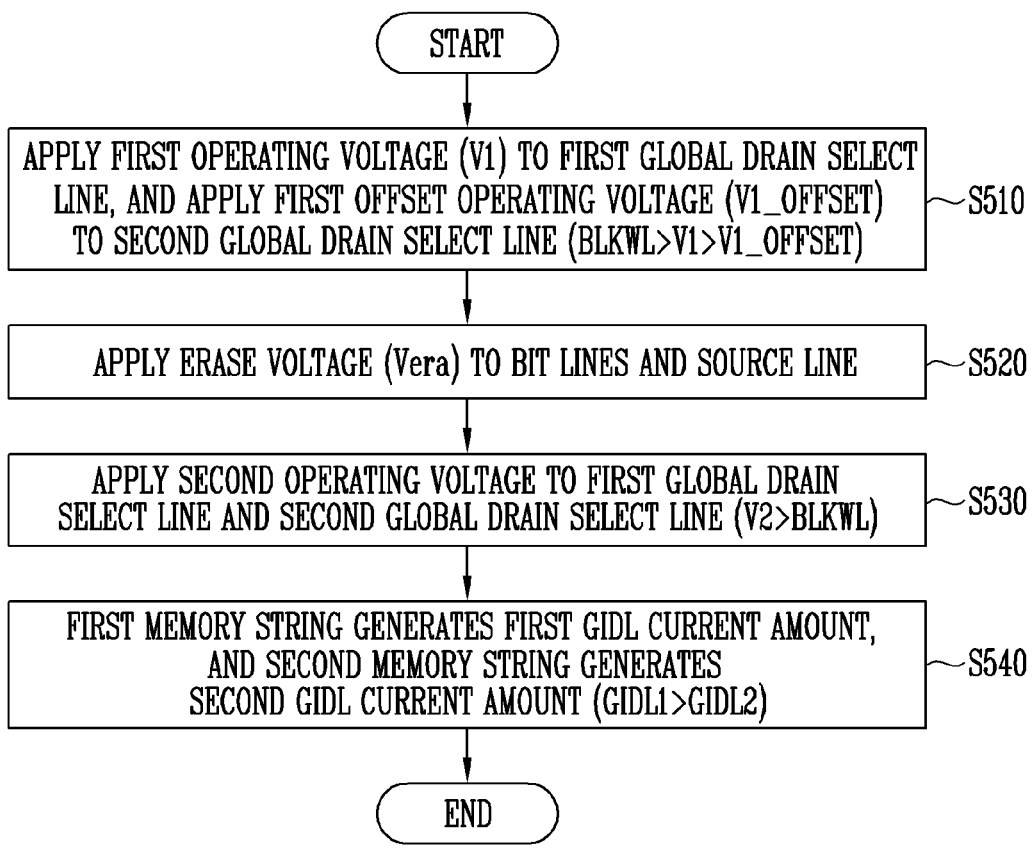
FIG. 5 is a flowchart illustrating a method of operating a semiconductor memory device according to an embodiment of the present disclosure.

FIG. 5 is a flowchart illustrating a method of operating a semiconductor memory device according to an embodiment of the present disclosure.

Figure 6:
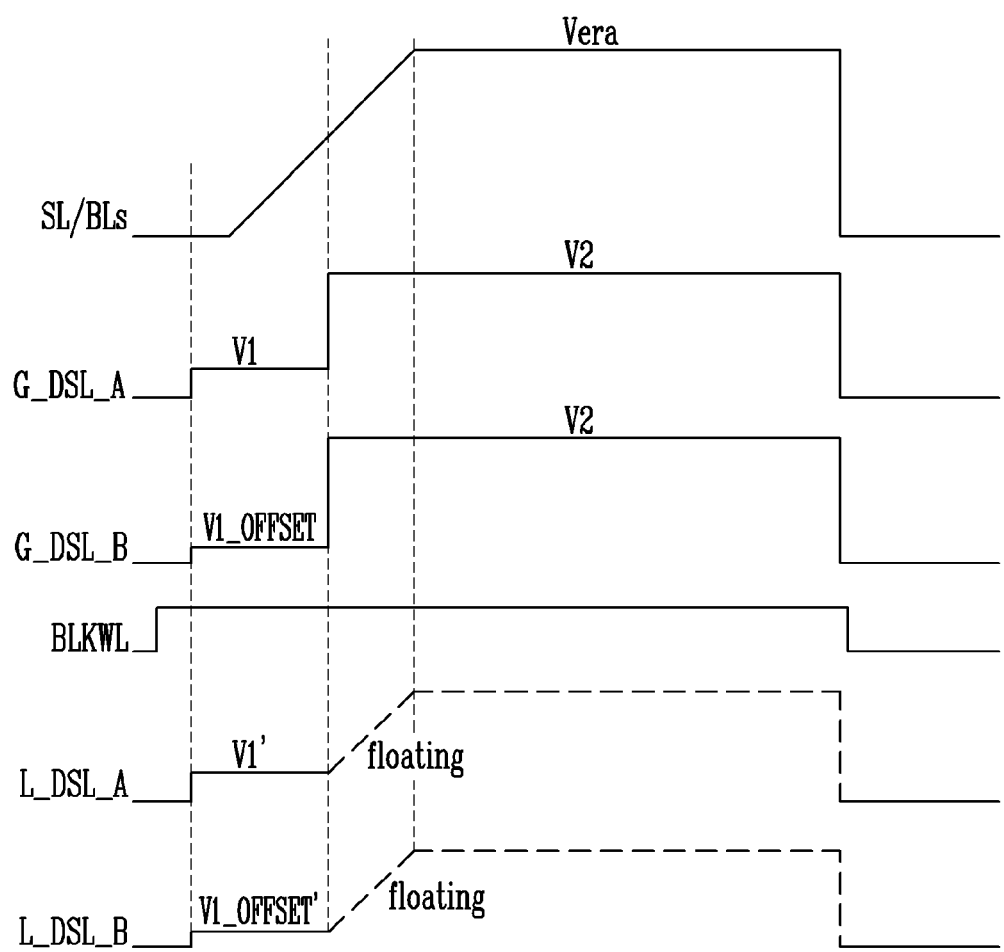
FIG. 6 is a waveform diagram of signals for explaining the method of operating a semiconductor memory device according to an embodiment of the present disclosure.

FIG. 6 is a waveform diagram of signals for explaining the method of operating a semiconductor memory device according to an embodiment of the present disclosure.

The method of operating the semiconductor memory device according to an embodiment of the present disclosure will be described in detail below with reference to FIGS. 1, 2, 5 and 6.

In an embodiment of the present disclosure, a description will be made on the assumption that the erase speed of a first memory cell string ST_A is lower than the erase speed of a second memory cell string ST_B. That is, the first memory cell string ST_A may be defined as a memory cell string having a relatively low erase speed, and the second memory cell string ST_B may be defined as a memory cell string having a relatively high erase speed.

At step S510, a first operating voltage V1 may be applied to a first global drain select line G_DSL_A, and a first offset operating voltage V1_OFFSET may be applied to a second global drain select line G_DSL_B. The potential of the first offset operating voltage V1_OFFSET may be lower than that of the first operating voltage V1.

For example, the block decoder 130 may generate a block select signal BLKWL having a high potential level in response to an address signal ADDR and a decoder control signal Decoder_signals. The pass circuit 120 may couple a plurality of global drain select lines G_DSLs, a plurality of global word lines G_WLs, and a plurality of global source select lines G_SSLs to a plurality of local drain select lines L_DSLs, a plurality of local word lines L_WLs, and a plurality of local source select lines L_SSLs, respectively, in response to the block select signal BLKWL having a high potential level.

The voltage generation circuit 111 may generate the first operating voltage V1 and apply the first operating voltage V1 to the first global drain select line G_DSL_A and the first global source select line G_SSL_A, and may generate the first offset operating voltage V1_OFFSET and apply the first offset operating voltage V1_OFFSET to the second global drain select line G_DSL_B and the second global source select line G_SSL_B, under the control of the control logic 150.

Accordingly, the first local drain select line L_DSL_A coupled to the first global drain select line G_DSL_A and the first local source select line L_SSL_A coupled to the first global source select line G_SSL_B may be charged to a potential voltage V1' that is equal to the first operating voltage V1 or lower than the first operating voltage V1 by the threshold voltage of a pass transistor. Further, the second local drain select line L_DSL_B coupled to the second global drain select line G_DSL_B and the second local source select line L_SSL_B coupled to the second global source select line G_SSL_B may be charged to a potential voltage V1_OFFESET' that is equal to the first offset operating voltage V1_OFFSET or lower than the first offset operating voltage V1_OFFSET by the threshold voltage of the pass transistor.

The potential of the first operating voltage V1 and the potential of the first offset operating voltage V1_OFFSET may be lower than that of the block select signal BLKWL.

At step S520, an erase voltage Vera may be applied to the bit lines BL1 to BLm and the source line SL of the memory block 140.

For example, the voltage generation circuit 111 may generate the erase voltage Vera that gradually increases as, for example shown in FIG. 6, and may apply the generated erase voltage Vera to the bit lines BL1 to BLm and the source line SL of the memory block 140, under the control of the control logic 150. After the erase voltage Vera has increased for a certain period, it may be maintained at a constant level, as illustrated in FIG. 6.

At step S530, a second operating voltage V2 may be applied to the first global drain select line G_DSL_A coupled to the first memory cell string ST_A and the second global drain select line G_DSL_B coupled to the second memory cell string ST_B.

For example, the voltage generation circuit 111 may generate the second operating voltage V2 having a potential higher than that of the first operating voltage V1 and apply the second operating voltage V2 to the first global drain select line G_DSL_A and the second global drain select line G_DSL_B, under the control of the control logic 150. Here, the voltage generation circuit 111 may apply the second operating voltage V2 to the first global source select line G_SSL_A and the second global source select line G_SSL_B.

The potential of the second operating voltage V2 may be higher than that of the block select signal BLKWL. Each of the pass transistor PT1 coupled to the first global drain select line G_DSL_A and the pass transistor PT2 coupled to the second global drain select line G_DSL_B may be turned off in response to the second operating voltage V2 having a potential higher than that of the block select signal BLKWL applied to the gate thereof, and the first local drain select line L_DSL_A and the second local drain select line L_DSL_B may float. Each of the pass transistor PT5 coupled to the first global source select line G_SSL_A and the pass transistor PT6 coupled to the second global source select line G_SSL_B may be turned off in response to the second operating voltage V2 having a potential higher than that of the block select signal BLKWL applied to the gate thereof, and the first local source select line L_SSL_A and the second local source select line L_SSL_B may float.

At step S540, a gate-induced drain leakage (GIDL) current may be generated in a channel in a lower portion of the drain select transistor DST_A of the first memory cell string ST_A and a channel in a lower portion of the drain select transistor DST_B of the second memory cell string ST_B, wherein the GIDL current amount of the first memory cell string ST_A, that is, a first GIDL current amount GIDL1, may be greater than the GIDL current amount of the second memory cell string ST_B, that is, a second GIDL current amount GIDL2. Furthermore, a GIDL current may be generated in a channel in a lower portion of the source select transistor SST_A of the first memory cell string ST_A and a channel in a lower portion of the source select transistor SST_B of the second memory cell string ST_B.

In the channel of the drain select transistor DST_A of the first memory cell string ST_A coupled to the first local drain select line L_DSL_A, a GIDL current is generated in response to the erase voltage Vera applied through the bit line BL1 and the first local drain select line L_DSL_A that is floating. Further, in the channel of the source select transistor SST_A of the first memory cell string ST_A, a GIDL current is generated in response to the erase voltage Vera applied through the source line SL and the first local source select line L_SSL_A that is floating. The gates of the drain select transistor DST_A and the source select transistor SST_A may be controlled to float, and the potentials thereof may then increase from the potential voltage V1' through a coupling phenomenon caused by the erase voltage Vera applied to the bit line BL1 and the source line SL. Accordingly, a GIDL current having a first GIDL current amount GIDL1 is generated in the channel of the drain select transistor DST_A and the channel of the source select transistor SST_A by the potential increased from the potential voltage V1' due to the coupling phenomenon and the erase voltage Vera applied to the bit line BL1 and the source line SL.

In the channel of the drain select transistor DST_B of the second memory cell string ST_B coupled to the second local drain select line L_DSL_B, a GIDL current is generated in response to the erase voltage Vera applied through the bit line BLm and the second local drain select line L_DSL_B that is floating. Further, in the channel of the source select transistor SST_B of the second memory cell string ST_B, a GIDL current is generated in response to the erase voltage Vera applied through the source line SL and the second local source select line L_SSL_B that is floating. The gates of the drain select transistor DST_B and the source select transistor SST_B may be controlled to float, and the potentials thereof may then increase from the potential voltage V1_OFFSET' through a coupling phenomenon caused by the erase voltage Vera applied to the bit line BLm and the source line SL. Therefore, gate potentials of the drain select transistor DST_B and the source select transistor SST_B may be lower than those of the drain select transistor DST_A and the source select transistor SST_A. A GIDL current having a second GIDL current amount GIDL2 is generated in the channel of the drain select transistor DST_A and the channel of the source select transistor SST_A by the potential increased from the potential voltage V1_OFFSET' due to the coupling phenomenon and the erase voltage Vera applied to the bit line BLm and the source line SL. The second GIDL current amount GIDL2 may be less than the first GIDL current amount GIDL1.

The channel of the first memory cell string ST_A may be boosted by the first GIDL current amount GIDL1, and the channel of the second memory cell string ST_B may be boosted by the second GIDL current amount GIDL2.

Thereafter, the erase voltage Vera may be maintained at a constant level after increasing to a target level, and the voltage generation circuit 111 may apply an erase operating voltage, for example, 0 V, to the plurality of global word lines G_WLs under the control of the control logic 150. Accordingly, an erase operation may be performed on the memory cells MC1 to MCn of the first memory cell string ST_A and the second memory cell string ST_B depending on the difference between the boosting levels of the channels and the potential levels of the local word lines L_WLs.

Here, the channel of the first memory cell string ST_A may be boosted to a level higher than that of the channel of the second memory cell string ST_B by the first GIDL current amount GIDL1 greater than the second GIDL current amount GIDL2, and thus the first memory cell string ST_A having a relatively low erase speed and the second memory cell string ST_B having a relatively high erase speed may be erased at a uniform speed.

Figure 7:
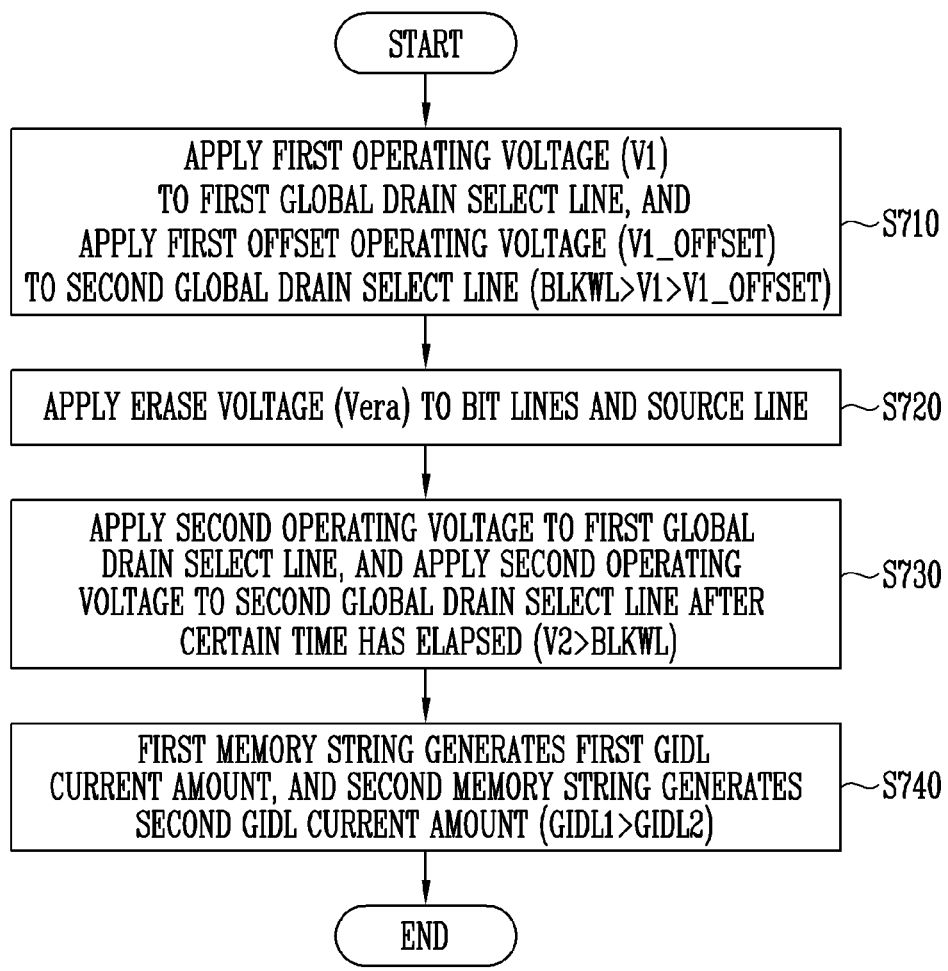
FIG. 7 is a flowchart illustrating a method of operating a semiconductor memory device according to an embodiment of the present disclosure.

FIG. 7 is a flowchart illustrating a method of operating a semiconductor memory device according to an embodiment of the present disclosure.

Figure 8:
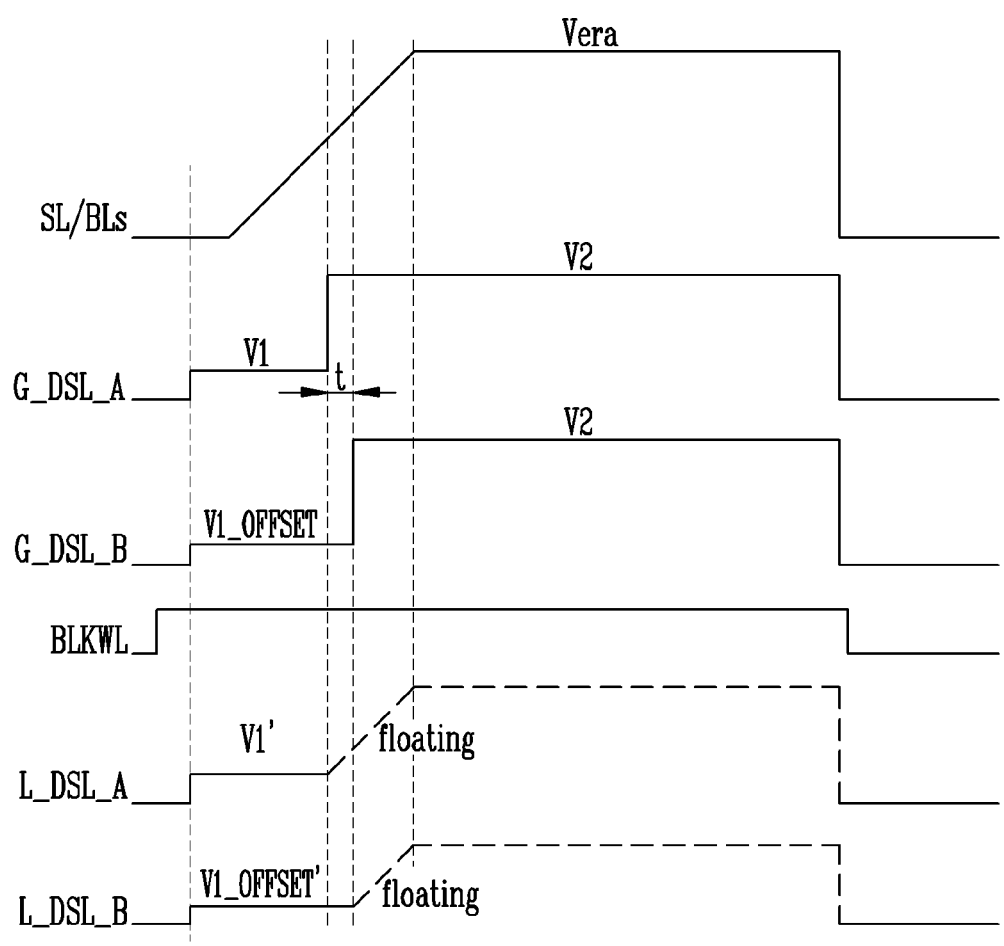
FIG. 8 is a waveform diagram of signals for explaining the method of operating a semiconductor memory device according to an embodiment of the present disclosure.

FIG. 8 is a waveform diagram of signals for explaining the method of operating a semiconductor memory device according to an embodiment of the present disclosure.

The method of operating the semiconductor memory device according to an embodiment of the present disclosure will be described with reference to FIGS. 1, 2, 7 and 8.

In an embodiment of the present disclosure, a description will be made on the assumption that the erase speed of a first memory cell string ST_A is lower than the erase speed of a second memory cell string ST_B. That is, the first memory cell string ST_A may be defined as a memory cell string having a relatively low erase speed, and the second memory cell string ST_B may be defined as a memory cell string having a relatively high erase speed.

At step S710, a first operating voltage V1 may be applied to a first global drain select line G_DSL_A, and a first offset operating voltage V1_OFFSET may be applied to a second global drain select line G_DSL_B. The potential of the first offset operating voltage V1_OFFSET may be lower than that of the first operating voltage V1.

For example, the block decoder 130 may generate a block select signal BLKWL having a high potential level in response to an address signal ADDR and a decoder control signal Decoder_signals. The pass circuit 120 may couple a plurality of global drain select lines G_DSLs, a plurality of global word lines G_WLs, and a plurality of global source select lines G_SSLs to a plurality of local drain select lines L_DSLs, a plurality of local word lines L_WLs, and a plurality of local source select lines L_SSLs, respectively, in response to the block select signal BLKWL having a high potential level.

The voltage generation circuit 111 may generate the first operating voltage V1 and apply the first operating voltage V1 to the first global drain select line G_DSL_A and the first global source select line G_SSL_A, and may generate the first offset operating voltage V1_OFFSET and apply the first offset operating voltage V1_OFFSET to the second global drain select line G_DSL_B and the second global source select line G_SSL_B, under the control of the control logic 150.

Accordingly, the first local drain select line L_DSL_A coupled to the first global drain select line G_DSL_A and the first local source select line L_SSL_A coupled to the first global source select line G_SSL_B may be charged to a potential voltage V1' that is equal to the first operating voltage V1 or lower than the first operating voltage V1 by the threshold voltage of a pass transistor. Further, the second local drain select line L_DSL_B coupled to the second global drain select line G_DSL_B and the second local source select line L_SSL_B coupled to the second global source select line G_SSL_B may be charged to a potential voltage V1_OFFESET' that is equal to the first offset operating voltage V1_OFFSET or lower than the first offset operating voltage V1_OFFSET by the threshold voltage of the pass transistor.

The potential of the first operating voltage V1 and the potential of the first offset operating voltage V1_OFFSET may be lower than that of the block select signal BLKWL.

At step S720, an erase voltage Vera may be applied to the bit lines BL1 to BLm and the source line SL of the memory block 140.

For example, under the control of the control logic 150, the voltage generation circuit 111 may generate the erase voltage Vera that gradually increases as, for example shown in FIG. 8, and may apply the generated erase voltage Vera to the bit lines BL1 to BLm and the source line SL of the memory block 140. After the erase voltage Vera has increased for a certain period, it may be maintained at a constant level, as illustrated in FIG. 8.

At step S730, a second operating voltage V2 may be applied to the first global drain select line G_DSL_A coupled to the first memory cell string ST_A having a relatively low erase speed. After a certain time t has elapsed, the second operating voltage V2 may be applied to the second global drain select line G_DSL_B coupled to the second memory cell string ST_B having a relatively high erase speed.

For example, under the control of the control logic 150, the voltage generation circuit 111 may generate the second operating voltage V2 having a potential higher than that of the first operating voltage V1, may apply the second operating voltage V2 to the first global drain select line G_DSL_A, and may apply the second operating voltage V2 to the second global drain select line G_DSL_B after the certain time t has elapsed. Furthermore, the voltage generation circuit 111 may generate the second operating voltage V2, may apply the second operating voltage V2 to the first global source select line G_SSL_A, and may apply the second operating voltage V2 to the second global source select line G_SSL_B after the certain time t has elapsed.

The potential of the second operating voltage V2 may be higher than that of the block select signal BLKWL. The pass transistor PT1 coupled to the first global drain select line G_DSL_A may be turned off in response to the second operating voltage V2 having a potential higher than that of the block select signal BLKWL applied to the gate thereof, and the first local drain select line L_DSL_A may float. Also, the pass transistor PT5 coupled to the first global source select line G_SSL_A may be turned off in response to the second operating voltage V2 having a potential higher than that of the block select signal BLKWL applied to the gate thereof, and the first local source select line L_SSL_A may float.

After the certain time t has elapsed, the pass transistor PT2 coupled to the second global drain select line G_DSL_B and the pass transistor PT6 coupled to the second global source select line G_SSL_B may be turned off in response to the second operating voltage V2 having a potential high than that of the block select signal BLKWL applied to the gates thereof, and the second local drain select line L_DSL_B and the second local source select line L_SSL_B may float. That is, the first local drain select line L_DSL_A may float earlier than the second local drain select line L_DSL_B by the certain time t. Further, the first local source select line L_SSL_A may float earlier than the second local source select line L_SSL_B by the certain time t.

At step S740, a gate-induced drain leakage (GIDL) current may be generated in a channel in a lower portion of the drain select transistor DST_A of the first memory cell string ST_A and a channel in a lower portion of the drain select transistor DST_B of the second memory cell string ST_B, wherein the GIDL current amount of the first memory cell string ST_A, that is, a first GIDL current amount GIDL1, may be greater than the GIDL current amount of the second memory cell string ST_B, that is, a second GIDL current amount GIDL2. Furthermore, a GIDL current may be generated in a channel in a lower portion of the source select transistor SST_A of the first memory cell string ST_A and a channel in a lower portion of the source select transistor SST_B of the second memory cell string ST_B.

In the channel of the drain select transistor DST_A of the first memory cell string ST_A coupled to the first local drain select line L_DSL_A, a GIDL current is generated in response to the erase voltage Vera applied through the bit line BL1 and the first local drain select line L_DSL_A that is floating. Further, in the channel of the source select transistor SST_A of the first memory cell string ST_A, a GIDL current is generated in response to the erase voltage Vera applied through the source line SL and the first local source select line L_SSL_A that is floating. The gates of the drain select transistor DST_A and the source select transistor SST_A may be controlled to float, and the potentials thereof may then increase from the potential voltage V1' through a coupling phenomenon caused by the erase voltage Vera applied to the bit line BL1 and the source line SL. Accordingly, a GIDL current having a first GIDL current amount GIDL1 is generated in the channel of the drain select transistor DST_A and the channel of the source select transistor SST_A by the potential increased from the potential voltage V1' due to the coupling phenomenon and the erase voltage Vera applied to the bit line BL1 and the source line SL.

In the channel of the drain select transistor DST_B of the second memory cell string ST_B coupled to the second local drain select line L_DSL_B, a GIDL current is generated in response to the erase voltage Vera applied through the bit line BLm and the second local drain select line L_DSL_B that is floating. Further, in the channel of the source select transistor SST_B of the second memory cell string ST_B, a GIDL current is generated in response to the erase voltage Vera applied through the source line SL and the second local source select line L_SSL_B that is floating. The gates of the drain select transistor DST_B and the source select transistor SST_B may be controlled to float, and the potentials thereof may then increase from the potential voltage V1_OFFSET' through a coupling phenomenon caused by the erase voltage Vera applied to the bit line BLm and the source line SL. Therefore, gate potentials of the drain select transistor DST_B and the source select transistor SST_B may be lower than those of the drain select transistor DST_A and the source select transistor SST_A. A GIDL current having a second GIDL current amount GIDL2 is generated in the channel of the drain select transistor DST_A and the channel of the source select transistor SST_A by the potential increased from the potential voltage V1_OFFSET' due to the coupling phenomenon and the erase voltage Vera applied to the bit line BLm and the source line SL. The second GIDL current amount GIDL2 may be less than the first GIDL current amount GIDL1. Furthermore, because the first local drain select line L_DSL_A floats earlier than the second local drain select line L_DSL_B by the certain time t, the first GIDL current amount GIDL1 of the first memory cell string ST_A may be greater than the second GIDL current amount GIDL2 of the second memory cell string ST_B.

The channel of the first memory cell string ST_A may be boosted by the first GIDL current amount GIDL1, and the channel of the second memory cell string ST_B may be boosted by the second GIDL current amount GIDL2.

Thereafter, the erase voltage Vera may be maintained at a constant level after increasing to a target level, and the voltage generation circuit 111 may apply an erase operating voltage, for example, 0 V, to the plurality of global word lines G_WLs, under the control of the control logic 150. Accordingly, an erase operation may be performed on the memory cells MC1 to MCn of the first memory cell string ST_A and the second memory cell string ST_B depending on the difference between the boosting levels of the channels and the potential levels of the local word lines L_WLs.

Here, the channel of the first memory cell string ST_A may be boosted to a level higher than that of the channel of the second memory cell string ST_B by the first GIDL current amount GIDL1 greater than the second GIDL current amount GIDL2, and thus the first memory cell string ST_A having a relatively low erase speed and the second memory cell string ST_B having a relatively high erase speed may be erased at a uniform speed.

Figure 9:
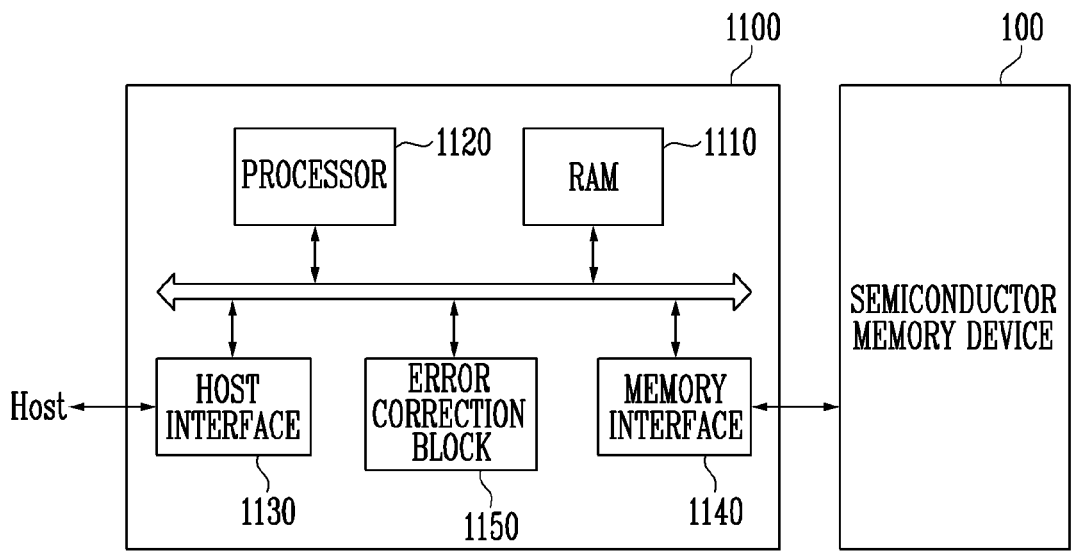
FIG. 9 is a block diagram illustrating a memory system including the semiconductor memory device of FIG. 1.

FIG. 9 is a block diagram illustrating a memory system including the semiconductor memory device of FIG. 1.

Referring to FIG. 9, a memory system 1000 includes a semiconductor memory device 100 and a controller 1100.

The semiconductor memory device 100 may have the same configuration and operation as those of the semiconductor memory device described with reference to FIG. 1. Hereinafter, repetitive explanations will be omitted.

The controller 1100 is coupled to a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the semiconductor memory device 100 and the host Host. The controller 1100 may run firmware for controlling the semiconductor memory device 100.

The controller 1100 includes a random access memory (RAM) 1110, a processor 1120, a host interface 1130, a memory interface 1140, and an error correction block 1150. The RAM 1110 is used as at least one of a working memory for the processor 1120, a cache memory between the semiconductor memory device 100 and the host Host, and a buffer memory between the semiconductor memory device 100 and the host. The processor 1120 controls the overall operation of the controller 1100. In addition, the controller 1100 may temporarily store program data provided from the host Host during a write operation.

The host interface 1130 may include a protocol for performing data exchange between the host Host and the controller 1100. In an embodiment, the controller 1100 may communicate with the host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, and an integrated drive electronics (IDE) protocol, and a private protocol.

The memory interface 1140 interfaces with the semiconductor memory device 100. For example, the memory interface 1140 may include a NAND interface or NOR interface.

The error correction block 1150 may detect and correct errors in data received from the semiconductor memory device 100 using an error correction code (ECC). The processor 1120 may adjust a read voltage based on the result of error detection by the error correction block 1150, and may control the semiconductor memory device 100 to perform re-reading. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device to form a memory card, such as a PC card (personal computer memory card international association: PCM-CIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1100 and the semiconductor memory device 100 may be integrated into a single semiconductor device to form a semiconductor drive (solid state drive: SSD). The SSD includes a storage device configured to store data in a semiconductor memory. When the memory system 1000 is used as the SSD, an operation speed of the host Host coupled to the memory system 1000 may be remarkably improved.

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an embodiment, the semiconductor memory device 100 or the memory system 1000 may be mounted in various types of packages. For example, the semiconductor memory device 100 or the memory system 1000 may be packaged in a type such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flatpack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

Figure 10:
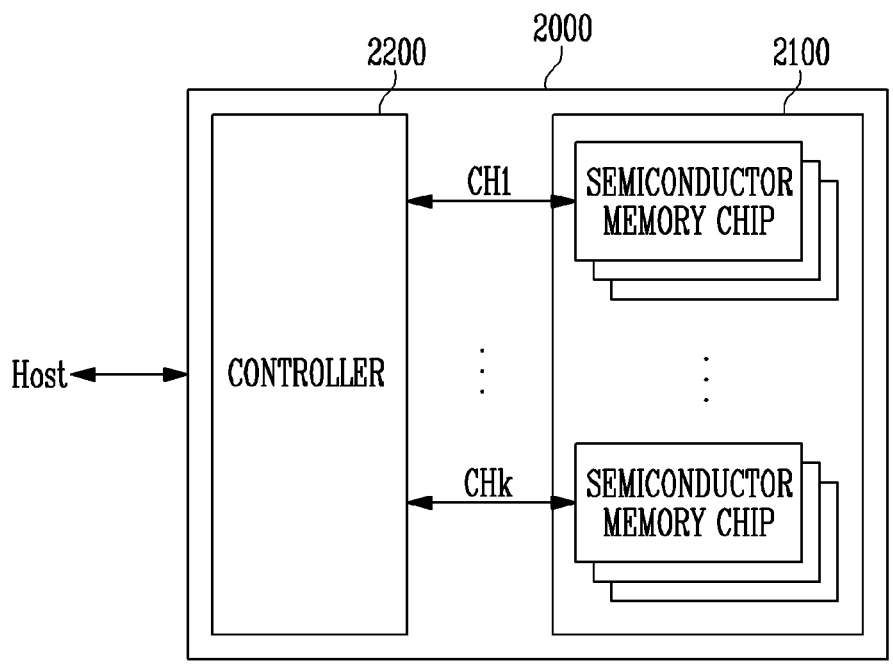
FIG. 10 is a block diagram illustrating an example of application of the memory system of FIG. 9.

FIG. 10 is a block diagram illustrating an example of application of the memory system of FIG. 9.

Referring to FIG. 10, a memory system 2000 may include a semiconductor memory device 2100 and a controller 2200. The semiconductor memory device 2100 may include a plurality of semiconductor memory chips. The semiconductor memory chips may be divided into a plurality of groups.

In FIG. 10, it is illustrated that the plurality of groups individually communicate with the controller 2200 through first to k-th channels CH1 to CHk. Each semiconductor memory chip may be configured and operated in the same manner as the semiconductor memory device 100 described with reference to FIG. 1.

Each group may communicate with the controller 2200 through one common channel. The controller 2200 may have the same configuration as the controller 1100 described with reference to FIG. 9, and may control a plurality of semiconductor memory chips of the semiconductor memory device 2100 through the plurality of channels CH1 to CHk.

Figure 11:
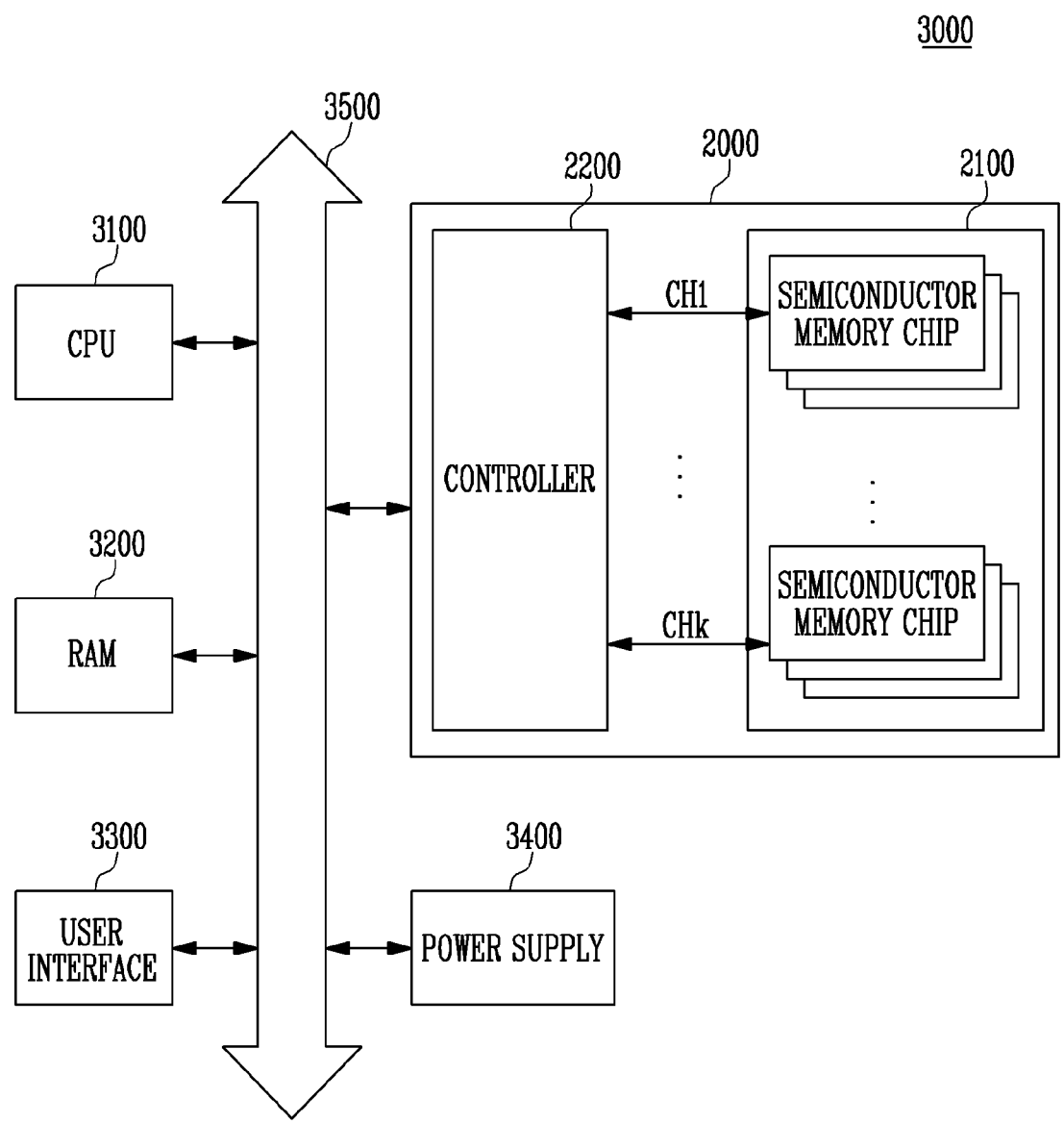
FIG. 11 is a block diagram illustrating a computing system including the memory system described with reference to FIG. 10.

FIG. 11 is a block diagram illustrating a computing system including the memory system described with reference to FIG. 10.

Referring to FIG. 11, the computing system 3000 includes a central processing unit (CPU) 3100, a RAM 3200, a user interface 3300, a power supply 3400, a system bus 3500, and a memory system 2000.

The memory system 2000 is electrically connected to the CPU 3100, the RAM 3200, the user interface 3300, and the power supply 3400 through the system bus 3500. Data provided through the user interface 3300 or processed by the CPU 3100 may be stored in the memory system 2000.

In FIG. 11, a semiconductor memory device 2100 is illustrated as being coupled to the system bus 3500 through the controller 2200. However, the semiconductor memory device 2100 may be directly coupled to the system bus 3500.

Here, a function of the controller 2200 may be performed by the CPU 3100 and the RAM 3200.

In FIG. 11, the memory system 2000 described with reference to FIG. 10 is illustrated as being provided. However, the memory system 2000 may be replaced with the memory system 1000 described with reference to FIG. 9. In an embodiment, the computing system 3000 may include both the memory systems 1000 and 2000 described with reference to FIGS. 9 and 10.

In accordance with various embodiments of the present disclosure, during an erase operation, the erase speeds of memory cell strings may be improved by boosting a channel of a memory cell string having a relatively low erase speed to a level higher than that of a channel of a memory cell string having a relatively high erase speed.

What is claimed is:

1. A semiconductor memory device, comprising:
   a memory block including a plurality of memory cell strings;
   a voltage supply circuit configured to apply operating voltages to global drain select lines, global source select lines, and global word lines, and to apply an erase voltage to bit lines of the memory block or to the bit lines and a source line of the memory block during an erase operation;
   a pass circuit configured to couple the global drain select lines, the global source select lines, and the global word lines to local drain select lines, local source select lines, and local word lines, respectively, in response to a block select signal; and
   control logic configured to control the voltage supply circuit to apply a first operating voltage to the global drain select lines and thereafter apply a second operating voltage, having a potential higher than a potential of the block select signal, to the global drain select lines,
   wherein the voltage supply circuit applies the second operating voltage to a first global drain select line, among the global drain select lines, and applies the second operating voltage to a second global drain select line, among the global drain select lines, after a certain time has elapsed.

2. The semiconductor memory device according to claim 1, wherein a first memory cell string corresponding to the first global drain select line, among the plurality of memory cell strings, is a memory cell string having an erase speed lower than an erase speed of a second memory cell string corresponding to the second global drain select line.

3. The semiconductor memory device according to claim 2, wherein the pass circuit is configured to:
   when the second operating voltage is applied to the first global drain select line, allow a first local drain select line, among the local drain select lines, to float, and when the second operating voltage is applied to the second global drain select line, allow a second local drain select line, among the local drain select lines, to float, and
   allow the first local drain select line to float, and allow the second local drain select line to float after the certain time has elapsed.

4. The semiconductor memory device according to claim 3, wherein:
   a potential of a channel of the first memory cell string is boosted by a first gate-induced drain leakage current having a first current amount generated in response to the erase voltage that is applied to the bit lines and the source line after floating of the first local drain select line, and
   a potential of a channel of the second memory cell string is boosted by a second gate-induced drain leakage current having a second current amount generated in response to the erase voltage that is applied to the bit lines and the source line after floating of the second local drain select line.

5. The semiconductor memory device according to claim 4, wherein the first current amount is greater than the second current amount.

6. The semiconductor memory device according to claim 1, wherein the first operating voltage has a potential lower than the potential of the block select signal.

7. The semiconductor memory device according to claim 1, wherein the voltage supply circuit generates the first operating voltage such that the first operating voltage applied to the first global drain select line has a potential higher than a potential of the first operating voltage applied to the second global drain select line.

8. The semiconductor memory device according to claim 2, wherein the control logic controls the voltage supply circuit to apply the first operating voltage to the global source select lines and thereafter applies the second operating voltage to the global source select lines.

9. The semiconductor memory device according to claim 8, wherein the voltage supply circuit applies the second operating voltage to a first global source select line, among the global source select lines, and, applies the second operating voltage to a second global source select line, among the global source select lines, after the certain time has elapsed.

10. The semiconductor memory device according to claim 9, wherein the first global source select line corresponds to the first memory cell string, and the second global source select line corresponds to the second memory cell string.

11. A method of operating a semiconductor memory device, comprising:
    coupling global drain select lines to local drain select lines of a memory block in response to a block select signal;
    applying a first operating voltage to the global drain select lines;
    applying an erase voltage to bit lines of the memory block or to the bit lines and a source line of the memory block;
    allowing a first local drain select line corresponding to a first memory cell string, among the local drain select lines, to float by applying a second operating voltage, having a potential higher than a potential of the block select signal, to a first global drain select line corresponding to the first memory cell string, among the global drain select lines; and
    allowing a second local drain select line corresponding to a second memory cell string, among the local drain select lines, to float by applying the second operating voltage to the first global drain select line, and applying the second operating voltage to a second global drain select line corresponding to the second memory cell string, among the global drain select lines, after a certain time has elapsed.

12. The method according to claim 11, further comprising:
    boosting a potential of a channel of the first memory cell string by a first gate-induced drain leakage current having a first current amount generated in response to the erase voltage that is applied to the bit lines and the source line after floating of the first local drain select line; and boosting a potential of a channel of the second memory cell string by a second gate-induced drain leakage current having a second current amount generated in response to the erase voltage that is applied to the bit lines and the source line after floating of the second local drain select line.

13. The method according to claim 12, wherein the first current amount is greater than the second current amount.

14. The method according to claim 11, wherein the first memory cell string is a memory cell string having an erase speed lower than an erase speed of the second memory cell string.

15. The method according to claim 11, wherein the first operating voltage has a potential lower than the potential of the block select signal.

16. The method according to claim 11, wherein, in applying the first operating voltage to the global drain select lines, the first operating voltage applied to the first global drain select line has a potential higher than a potential of the first operating voltage applied to the second global drain select line.

17. The method according to claim 11, wherein applying the first operating voltage to the global drain select lines comprises applying the first operating voltage to global source select lines.

18. The method according to claim 17, wherein allowing the first local drain select line to float by applying the second operating voltage to the first global drain select line comprises:

applying the second operating voltage to a first global source select line corresponding to the first memory cell string, among the global source select lines.

19. The method according to claim 17, wherein allowing the second local drain select line to float by applying the second operating voltage to the second global drain select line comprises:

applying the second operating voltage to a second global source select line corresponding to the second memory cell string, among the global source select lines.

* * * * *